United States Patent
Tian et al.

(10) Patent No.: US 9,214,167 B2
(45) Date of Patent: Dec. 15, 2015

(54) MAIN POLE LAYER WITH AT LEAST TOW SACRIFICIAL LAYERS AND A GAP LAYER

(71) Applicant: Seagate Technology LLC, Cupertino, CA (US)

(72) Inventors: Wei Tian, Eden Praire, MN (US); Venkateswara Rao Inturi, Shakopee, MN (US); Doug Lin, Eden Prairie, MN (US); Huaqing Yin, Eden Prairie, MN (US); Jiaoming Qiu, Maple Grove, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 13/796,951

(22) Filed: Mar. 12, 2013

(65) Prior Publication Data

US 2014/0268415 A1  Sep. 18, 2014

(51) Int. Cl.
| | |
|---|---|
| *G11B 5/187* | (2006.01) |
| *G11B 5/23* | (2006.01) |
| *G11B 5/127* | (2006.01) |
| *G11B 5/31* | (2006.01) |
| *G11B 5/235* | (2006.01) |

(52) U.S. Cl.
CPC .............. *G11B 5/232* (2013.01); *G11B 5/1278* (2013.01); *G11B 5/187* (2013.01); *G11B 5/235* (2013.01); *G11B 5/3109* (2013.01); *G11B 5/3116* (2013.01); *G11B 5/3143* (2013.01); *G11B 5/3163* (2013.01)

(58) Field of Classification Search
CPC ..... G11B 5/1278; G11B 5/187; G11B 5/3109
USPC ............ 360/119.01, 119.02, 119.03, 119.04, 360/125.3, 125.12
See application file for complete search history.

(56) References Cited

U.S. PATENT DOCUMENTS

| | | | |
|---|---|---|---|
| 3,959,824 A | | 5/1976 | Ohi et al. |
| 4,992,901 A | * | 2/1991 | Keel ...................... G11B 5/3163 216/22 |
| 5,729,413 A | | 3/1998 | Gooch et al. |
| 6,301,075 B1 | | 10/2001 | Sato |
| 6,724,569 B1 | | 4/2004 | Chen et al. |
| 6,876,507 B2 | | 4/2005 | Chen et al. |
| 6,975,486 B2 | | 12/2005 | Chen et al. |
| 7,525,760 B2 | | 4/2009 | Hsiao et al. |
| 7,631,417 B2 | | 12/2009 | Lam et al. |
| 8,238,059 B1 | * | 8/2012 | Tang et al. ............... 360/125.03 |
| 8,259,540 B1 | | 9/2012 | Sahoo et al. |
| 8,451,560 B2 | | 5/2013 | Hong et al. |
| 8,451,563 B1 | * | 5/2013 | Zhang et al. ............... 360/125.3 |

(Continued)

FOREIGN PATENT DOCUMENTS

JP    2007207419 A    8/2007

OTHER PUBLICATIONS

Extended European Search Report of EP Application No. 14159148.7, mailed Feb. 23, 2015, 9 pages.

*Primary Examiner* — Jefferson Evans
(74) *Attorney, Agent, or Firm* — HolzerIPLaw, PC

(57) ABSTRACT

In accordance with one embodiment, an apparatus may be implemented that comprises a main pole layer of magnetic material, a non-magnetic gap layer of material above the main pole layer, an etched first sacrificial layer of material above the non-magnetic gap layer of material, and a second sacrificial layer of material above the etched first sacrificial layer of material.

9 Claims, 14 Drawing Sheets

(56) References Cited

U.S. PATENT DOCUMENTS

| | | |
|---|---|---|
| 8,729,207 B2 | 5/2014 | Hartung et al. |
| 2003/0030940 A1 | 2/2003 | Matono |
| 2006/0044682 A1 | 3/2006 | Le et al. |
| 2007/0281079 A1* | 12/2007 | Carey et al. .................. 427/131 |
| 2009/0116145 A1 | 5/2009 | Guan et al. |
| 2009/0227067 A1* | 9/2009 | Kumar et al. ................. 438/104 |
| 2010/0061016 A1 | 3/2010 | Han et al. |
| 2011/0075295 A1* | 3/2011 | Zhang et al. ............ 360/123.37 |
| 2012/0164486 A1 | 6/2012 | Bonhote et al. |
| 2012/0238088 A1* | 9/2012 | Xiang et al. .................. 438/592 |
| 2012/0304454 A1 | 12/2012 | Jiang et al. |
| 2013/0020204 A1 | 1/2013 | Allen et al. |
| 2014/0037861 A1* | 2/2014 | Min ..................... G11B 5/1278 427/548 |
| 2014/0204485 A1 | 7/2014 | Shen et al. |
| 2014/0268415 A1 | 9/2014 | Tian et al. |
| 2014/0272471 A1* | 9/2014 | Tian ....................... G11B 5/332 428/812 |
| 2015/0002963 A1* | 1/2015 | Tian ......................... G11B 5/23 360/235.4 |

* cited by examiner

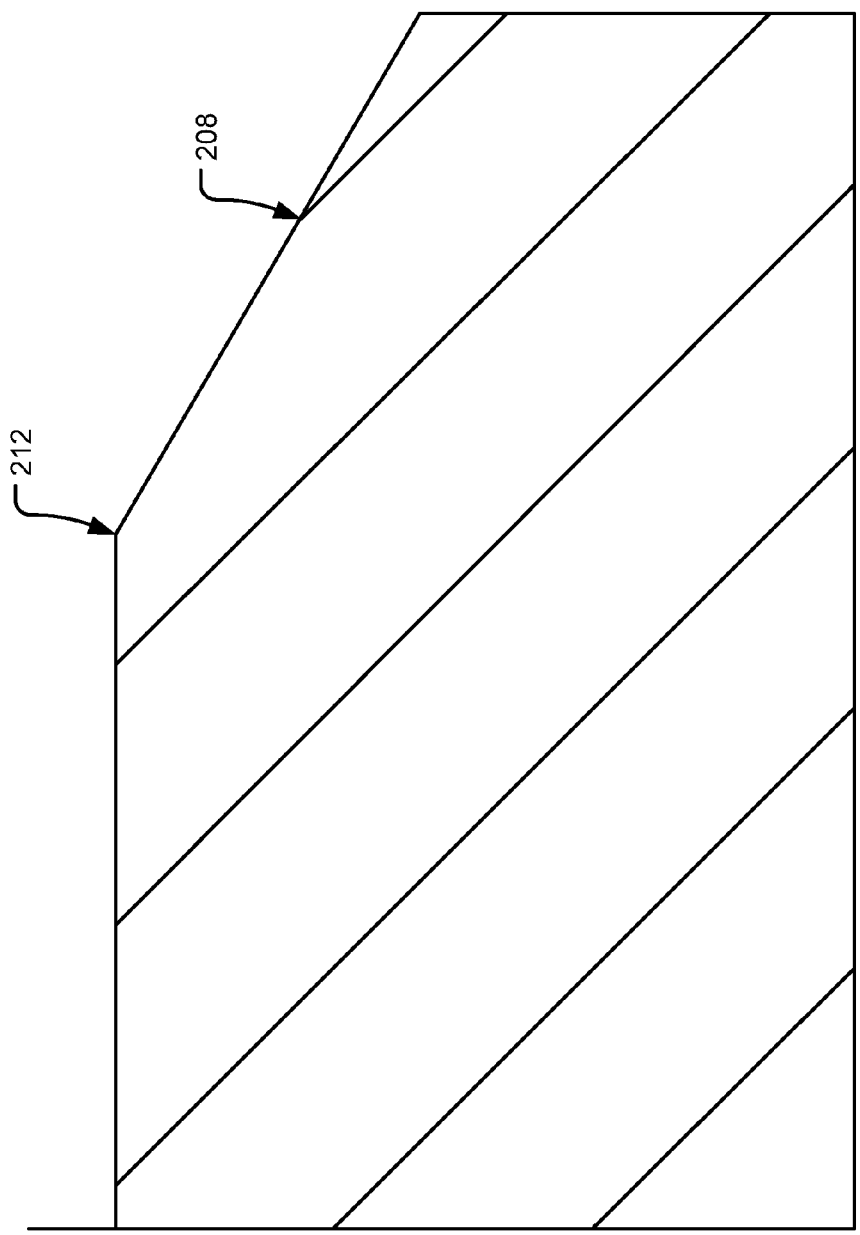

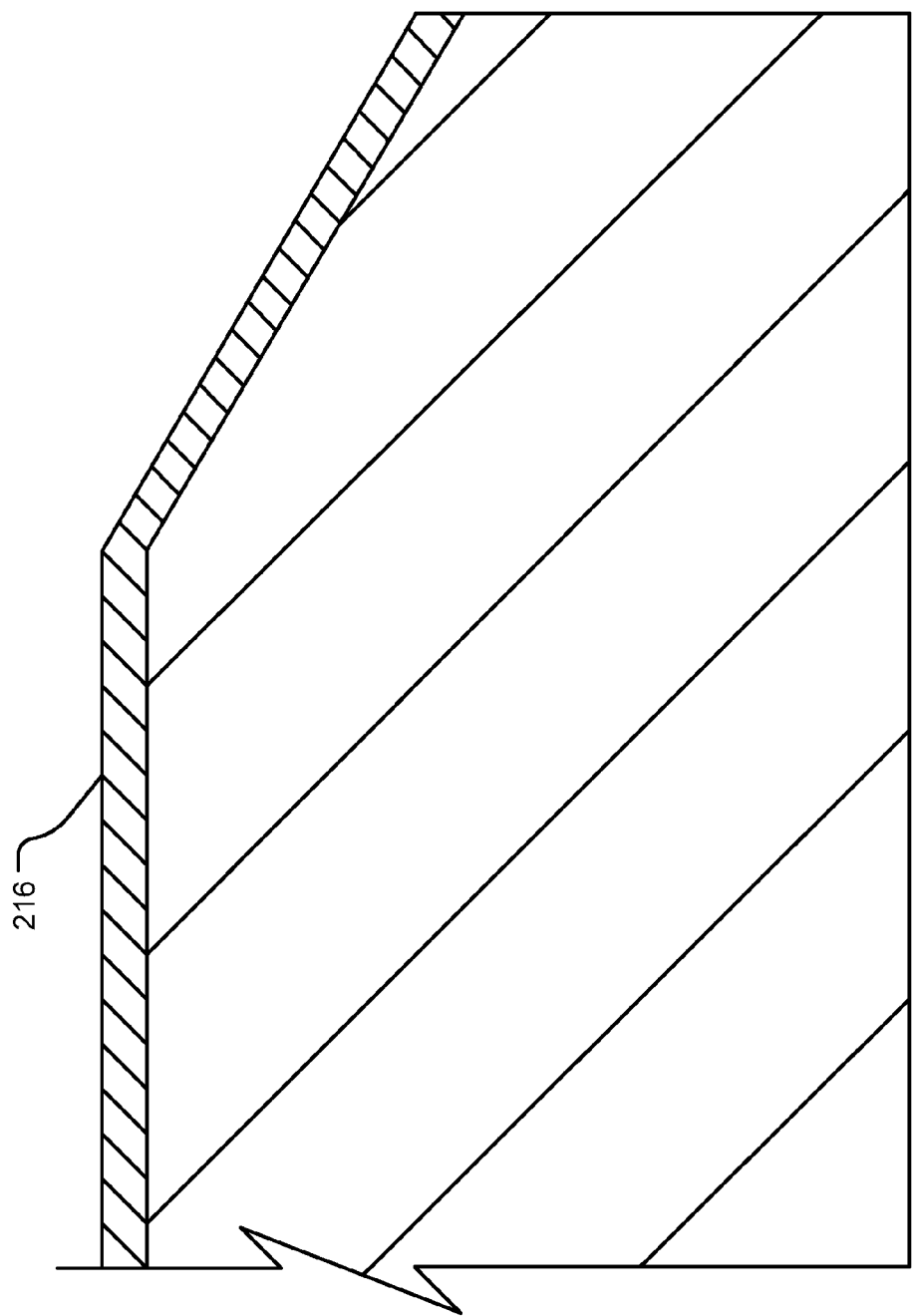

MAIN POLE LAYER WITH AT LEAST TOW SACRIFICIAL LAYERS AND A GAP LAYER

BACKGROUND

Processing steps are often used to form magnetic elements, such as magnetic recording heads used in the disc drive industry. The performance of magnetic elements can be influenced by the orientation and separation with respect to other magnetic elements. This particularly can be true as magnetic elements are placed in closer proximity to one another.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations and implementations as further illustrated in the accompanying drawings and defined in the appended claims.

In accordance with one embodiment, a method of forming a substantially uniform gap between two magnetic materials can comprise depositing a non-magnetic gap layer of material above a main pole layer of magnetic material; depositing a sacrificial layer of material above the non-magnetic gap layer of material; etching a portion of the sacrificial layer of material while not entirely removing the sacrificial layer of material; depositing additional sacrificial material to the etched sacrificial layer.

In accordance with another embodiment, an apparatus can comprise a main pole layer of magnetic material; a non-magnetic gap layer of material above the main pole layer; an etched first sacrificial layer of material above the non-magnetic gap layer of material; and a second sacrificial layer of material above the etched first sacrificial layer of material.

These and various other features and advantages will be apparent from a reading of the following detailed description.

BRIEF DESCRIPTION OF THE DRAWINGS

A further understanding of the nature and advantages of the present technology may be realized by reference to the figures, which are described in the remaining portion of the specification.

FIG. 2B illustrates a beveled edge formed on the initial layer of magnetic material, in accordance with one embodiment.

FIG. 2C illustrates an initial layer of material for use in the gap between two magnetic layers of material, in accordance with one embodiment.

DETAILED DESCRIPTION

Embodiments of the present technology are disclosed herein in the context of a disc drive system. However, it should be understood that the technology is not limited to a disc drive system and could readily be applied to other technology systems as well.

As areal density of magnetic recording media increases, more and more bits of information are being stored on the magnetic media. Thus, there is a need to store each bit of information in a smaller storage location than has previously been used. As a result, the write head of a disc drive needs to be able to record the bit on the magnetic media without disrupting the information stored in neighboring bit locations.

Write heads can be inefficient if there is a lack of a uniform gap between the magnetic material of the write pole and the magnetic material of the front shield. This non-uniformity allows more magnetic flux to leak from the write pole to the front shield during a write operation—rather than being directed through the targeted bit location. As a result, the write pole is less efficient in its write operation when this leakage occurs. A more uniform gap or even a gap that diverges rather than converges (when viewed from the perspective of moving towards an air bearing surface) would cause less leakage to occur.

In accordance with one embodiment a new process is disclosed that allows one to form a substantially uniform write gap between two magnetic materials as well as a resulting writer structure for a recording head. A magnetic overlayer with appropriate seeds (magnetic or non-magnetic) may also be formed on top of a non-magnetic write gap immediately following the deposition of any write gap layers of material. The write gap, together with the magnetic overlayer may be tailored to form a unique structure. In accordance with one embodiment, the process may be used to form a substantially uniform write gap, to reduce the gap thickness sigma, and to improve write performance of a write head with a narrow write gap. A deliberately selected non-magnetic seed may be used to enable a high moment magnetic layer to be in direct contact with a write gap without sacrificing the magnetic softness of the high moment magnetic materials. Moreover, configuring the material on both sides of the gap to have high moments without changing the magnetic softnesss of the magnetic materials can help to achieve improved writability. While the embodiments described as examples herein use a write head as an example, the process and structures may also be applied to other magnetic layers that are separated by a gap of material.

Figure 1:
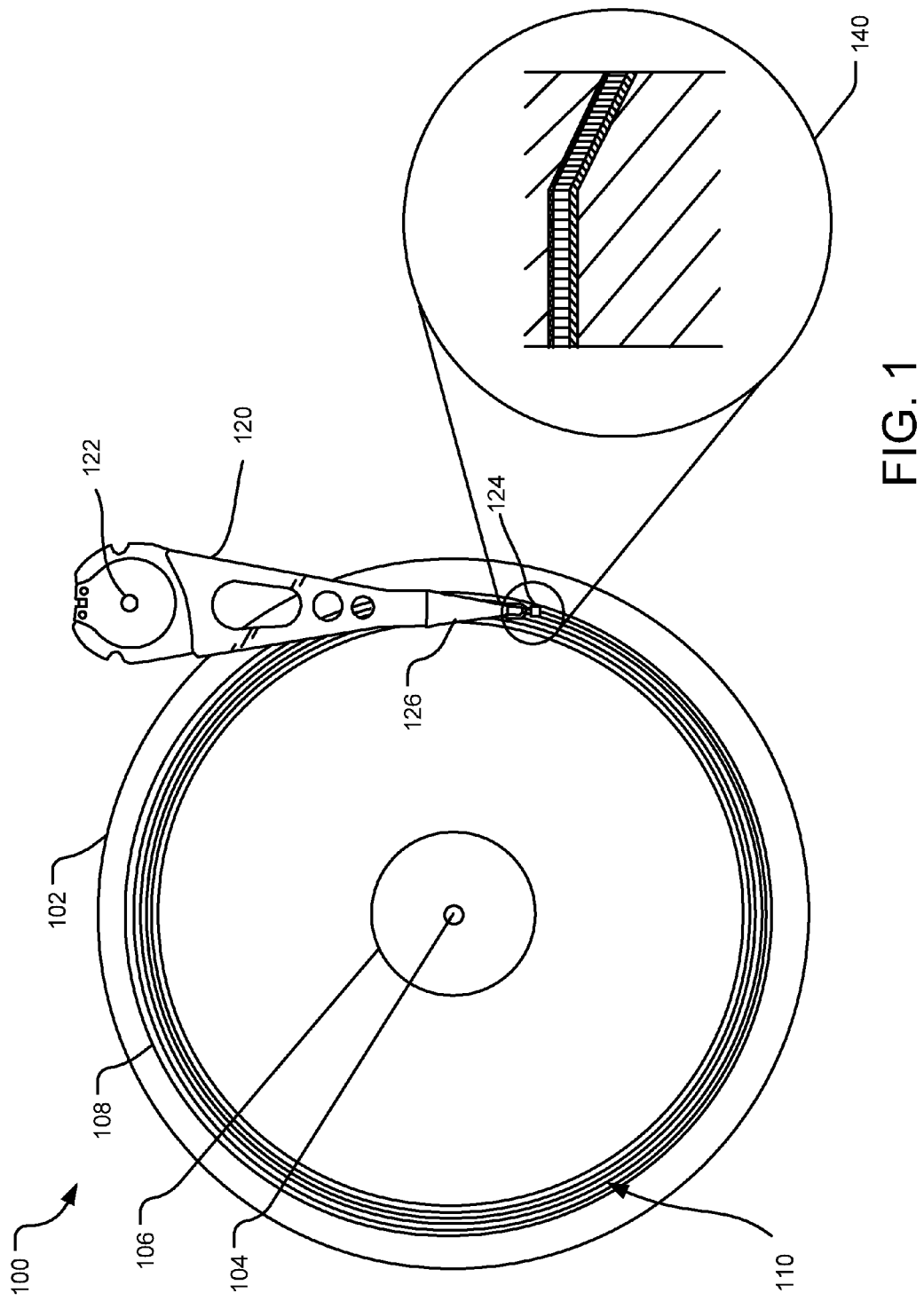
FIG. 1 illustrates an example diagram of a disc drive system with a cross-section of a substantially uniform write gap, in accordance with one embodiment.

With reference now to FIG. 1, an example of a disc drive system is shown. A disc drive system is but one example where disclosed technology may be utilized. FIG. 1 illustrates a perspective view 100 of an example. A disc 102 rotates about a spindle center or a disc axis of rotation 104 during operation. The disc 102 includes an inner diameter 106 and an outer diameter 108 between which are a number of concentric data tracks 110, illustrated by circular lines. The data tracks 110 are substantially circular.

Information may be written to and read from the bits on the disc 102 in different data tracks 110. A transducer head 124 is mounted on an actuator assembly 120 at an end distal to an actuator axis of rotation 122. The transducer head 124 flies in close proximity above the surface of the disc 102 during disc operation. The actuator assembly 120 rotates during a seek operation about the actuator axis of rotation 122 positioned adjacent to the disc 102. The seek operation positions the transducer head 124 over a target data track of the data tracks 110.

The exploded view 140 illustrates a cross-section of a portion of the transducer head 124 (not to scale). The cross-section shows a substantially uniform write-gap that can be configured in accordance with one embodiment.

As the areal density of magnetic recording media increases, information can be stored in smaller and smaller locations. This requires that the read head and write heads be able to read from and write to, respectively, those locations. A write gap is the non-magnetic gap separating the main writer pole from the front shield in a write head. The thickness of the write gap and the magnetic materials that are in the vicinity of the write gap can have great impact upon the writability and the trailing edge (TE) field gradient. To date, the write gap thicknesses are in the range of about 30 nm.

During the process of forming write gaps, it is not uncommon to perform photolithography and etch processes on the deposited write gap material. This results in the write gap being deteriorated unevenly across its surface. Where the write gap contains a bevel edge, one result is that the write gap can become tapered or pinched near the top of the bevel point. Thus, a non-uniform write gap is often produced by these photolithography and etching steps. A non-uniform write gap can result in more flux shunt to the front shield from the main writer pole during operation. This loss of flux makes a write operation less efficient and possibly defective. It can be referred to as suppressing writability.

Referring now to FIGS. 2A, 2B, 2C, 2D, 2E, 2F, 2G, and 2H a process for forming a more uniform write gap can be illustrated in accordance with one embodiment. This process may also be used to reduce the write gap sigma. It will also be appreciated from the following description that this process enables an alternative seed, such as Ruthenium, to be used as a seed layer for the 2.4 T FeCo layer of the front shield. Moreover, such a seed layer allows a FeCo magnetic layer to be in intimate contact with the write gap in order to provide an enhanced TE field gradient.

Figure 2A:
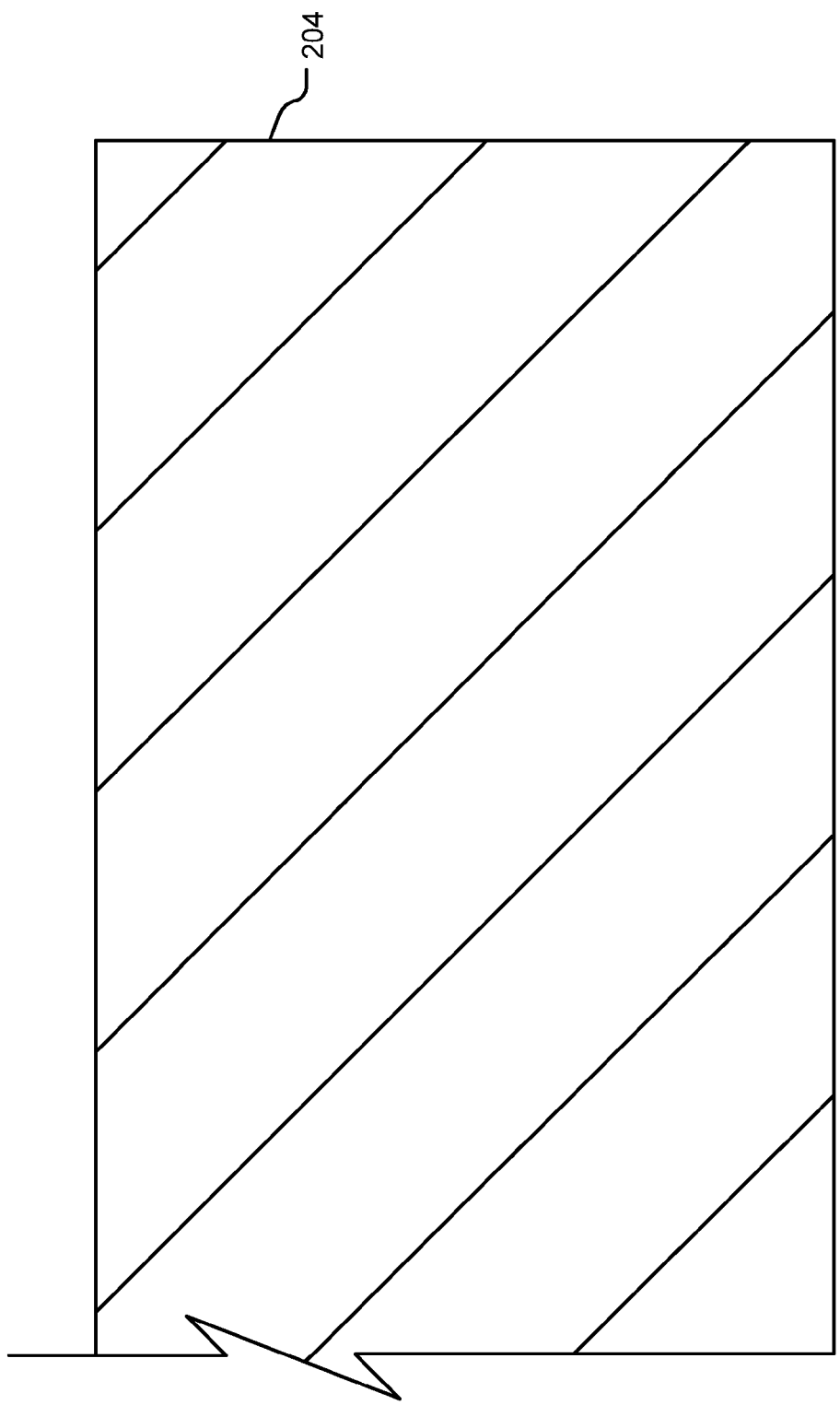
FIG. 2A illustrates an initial layer of magnetic material for use in forming a main pole, in accordance with one embodiment.

In FIG. 2A a first layer of magnetic material 204 is deposited. The magnetic material may be formed, for example, from FeCo. This layer of magnetic material may ultimately serve as the main write pole during operation of a write head. To form the main write pole, one may bevel the magnetic material layer 204 to form a bevel edge 208 and a bevel point 212, as shown in FIG. 2B. The bevel may be formed by milling the magnetic layer, for example.

In FIG. 2C, a first layer of gap material 216 is shown deposited on the top of the magnetic material layer 204. One type of material that may be utilized is Ruthenium. Ruthenium is a non-magnetic material that can perform well as a gap material. It can also serve as a seed layer for a second layer of gap material.

Figure 2D:
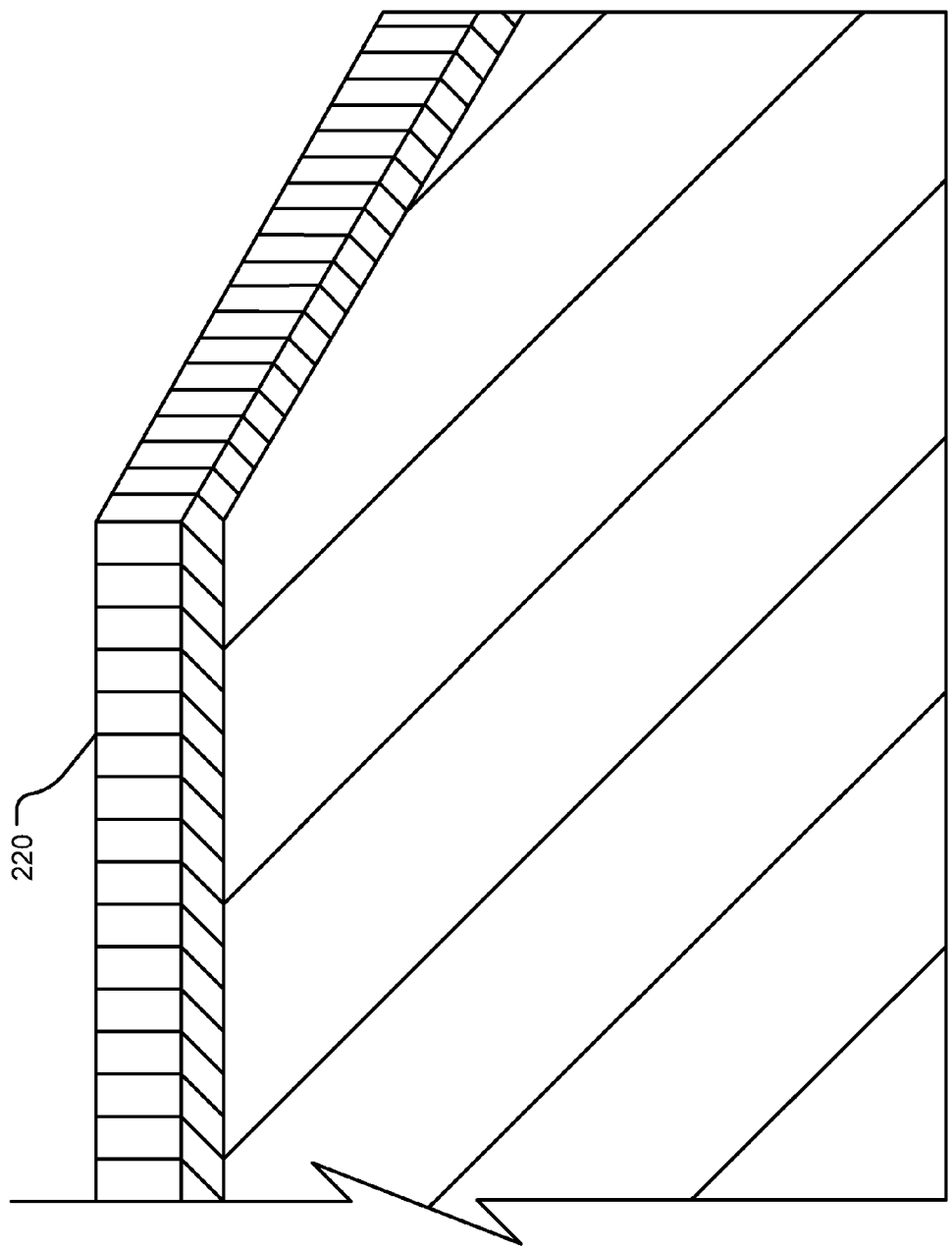
FIG. 2D illustrates a second layer of material for use in the gap between two magnetic layers of material, in accordance with one embodiment.

In FIG. 2D, a second layer of gap material 220 is shown as deposited on the top of the first layer of gap material. One material that can be useful as a gap material is $Al_2O_3$ also referred to as alumina.

Figure 2E:
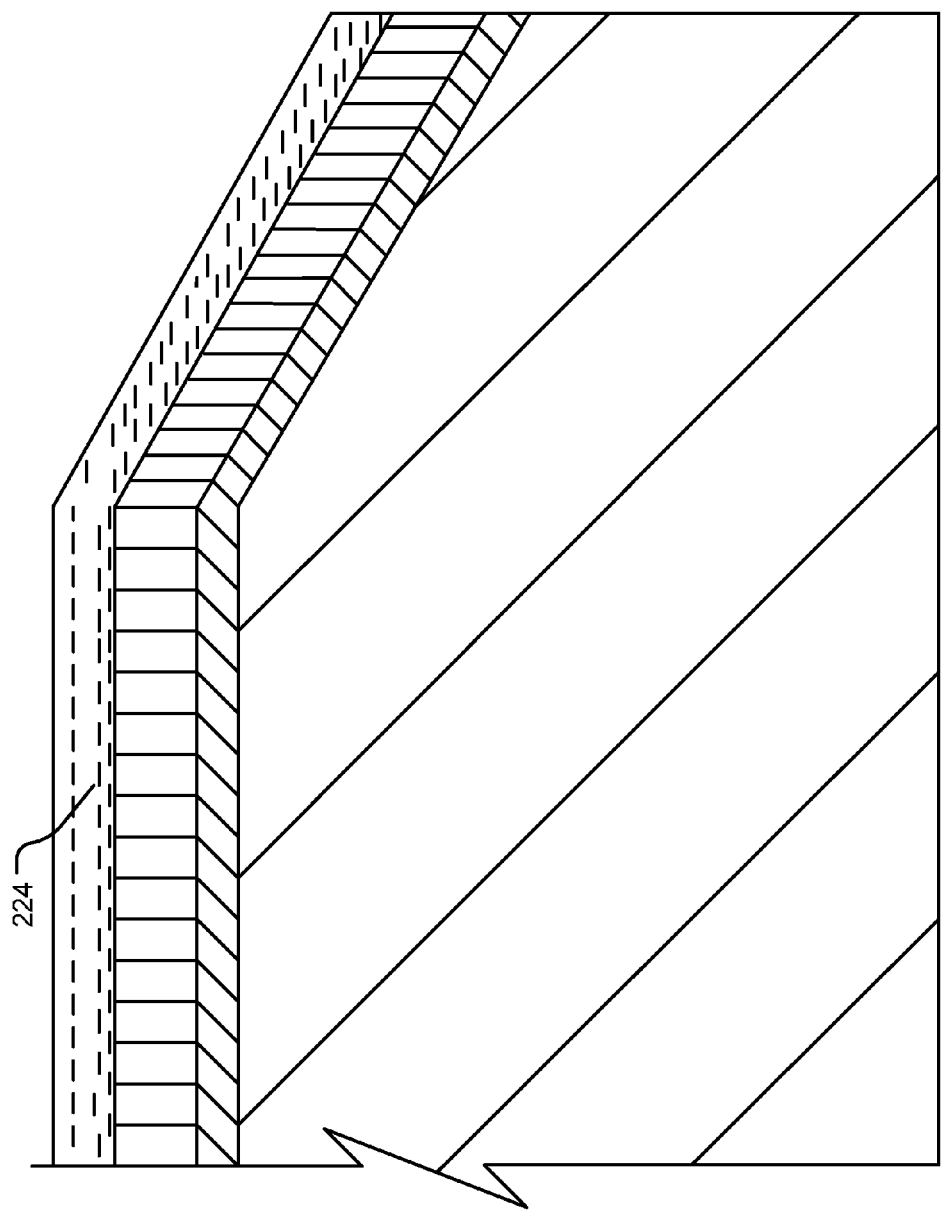
FIG. 2E illustrates a sacrificial layer of material disposed over the initial gap materials, in accordance with one embodiment.
Figure 2F:
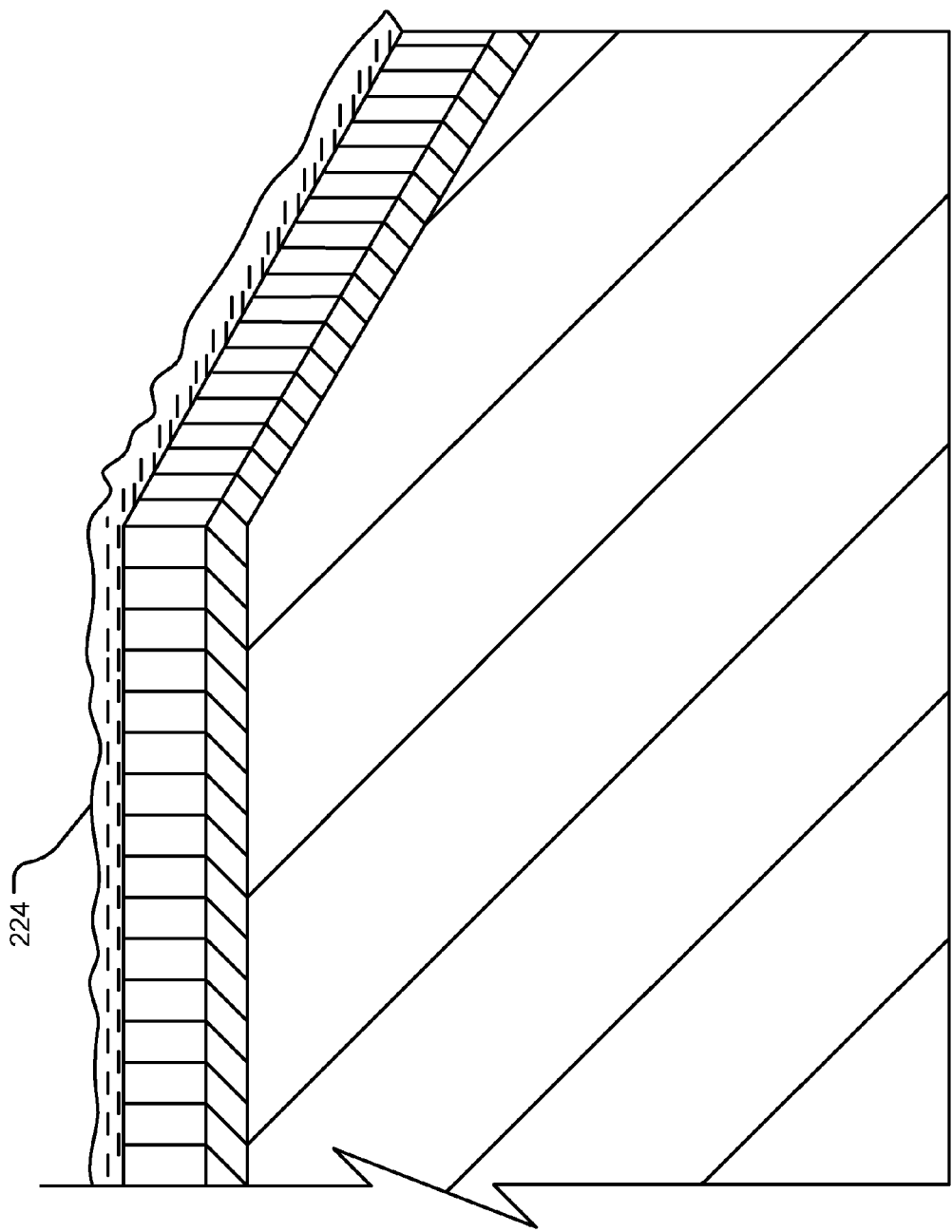
FIG. 2F illustrates the sacrificial layer after processing has occurred that created an uneven surface to the sacrificial layer, in accordance with one embodiment.

In FIG. 2E, a first layer of sacrificial material is shown as deposited on the top of the second layer of gap material. Oftentimes, one will choose to perform photolithography and etching steps before depositing the final layer of magnetic material. Such processing steps can affect the uniformity of the gap materials that have previously been deposited—particularly in the bevel edge region. One non-uniformity that can take place is that the write gap becomes tapered at the bevel point. As noted earlier, this can result in a non-uniform write-gap in a finished write head that causes decreased performance by the write head. Examples of processing steps that are often performed include a photolithography step that is followed by an etching step. Other processing steps might alternatively be performed. Regardless, the result is that the write gap is left in a non-uniform state. By utilizing a sacrificial layer that can be refurbished by deposition of additional sacrificial material, the uniformity of the gap can be substantially restored following the damaging processing steps. Thus, FIG. 2F shows the effects of the damaging processing steps on the sacrificial layer 224. As can be seen, the damaging processing steps leave the sacrificial layer in an uneven state, while the underlying gap layers are undamaged. It should be noted that the sacrificial layer may be seeded by a seed layer. One choice of seed layer material is Ruthenium. Other non-magnetic seed material may be used rather than Ruthenium.

Figure 2G:
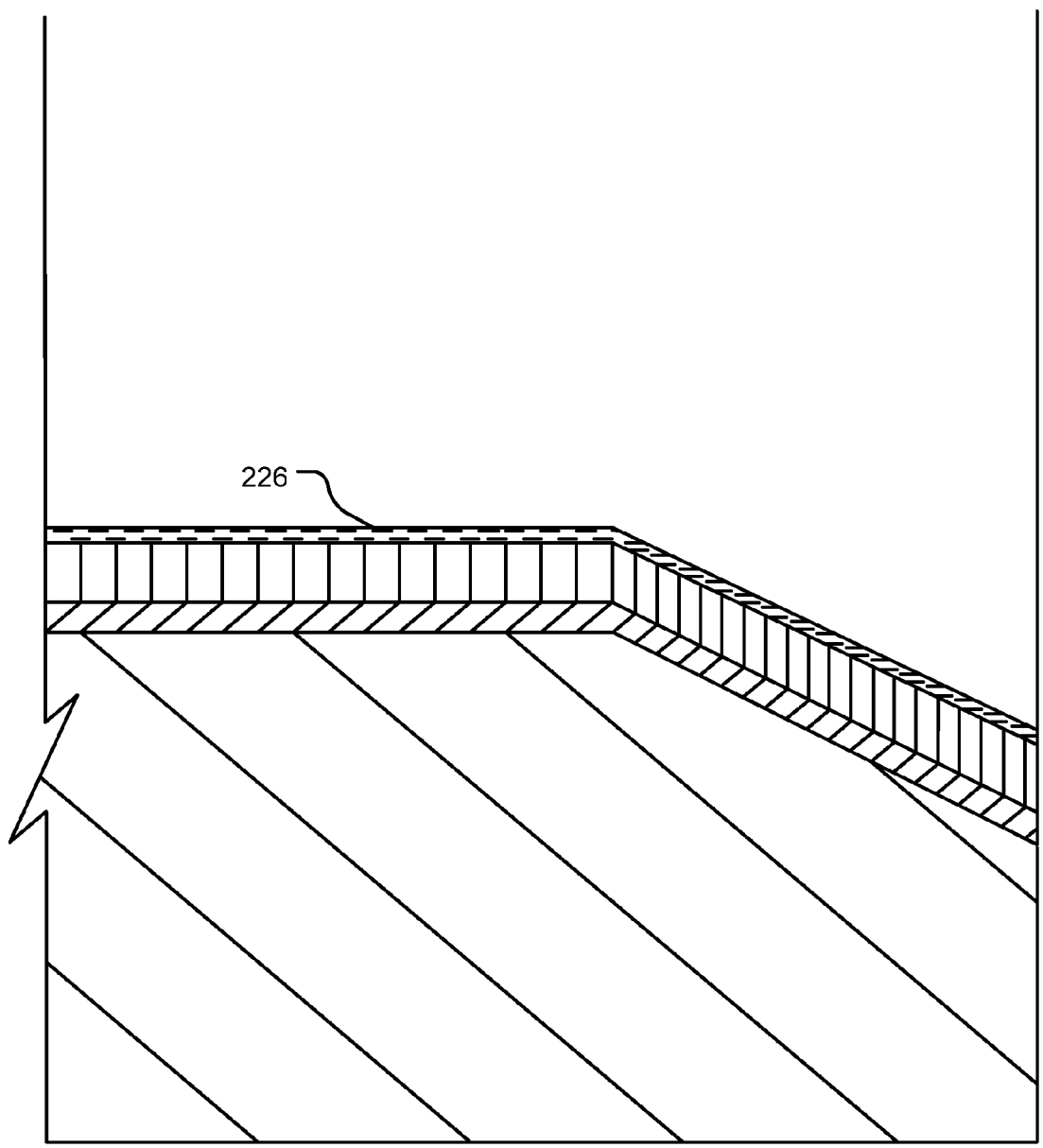
FIG. 2G illustrates further deposition of sacrificial layer material to form an even top surface to the sacrificial layer, in accordance with one embodiment.

In FIG. 2G, additional sacrificial material may be deposited so as to restore the sacrificial layer to a substantially uniform thickness. The restored sacrificial layer is referred to as layer 226 in FIG. 2G. The sacrificial layer can also be selected so as to serve as a seed layer for a subsequent magnetic layer.

Figure 2H:
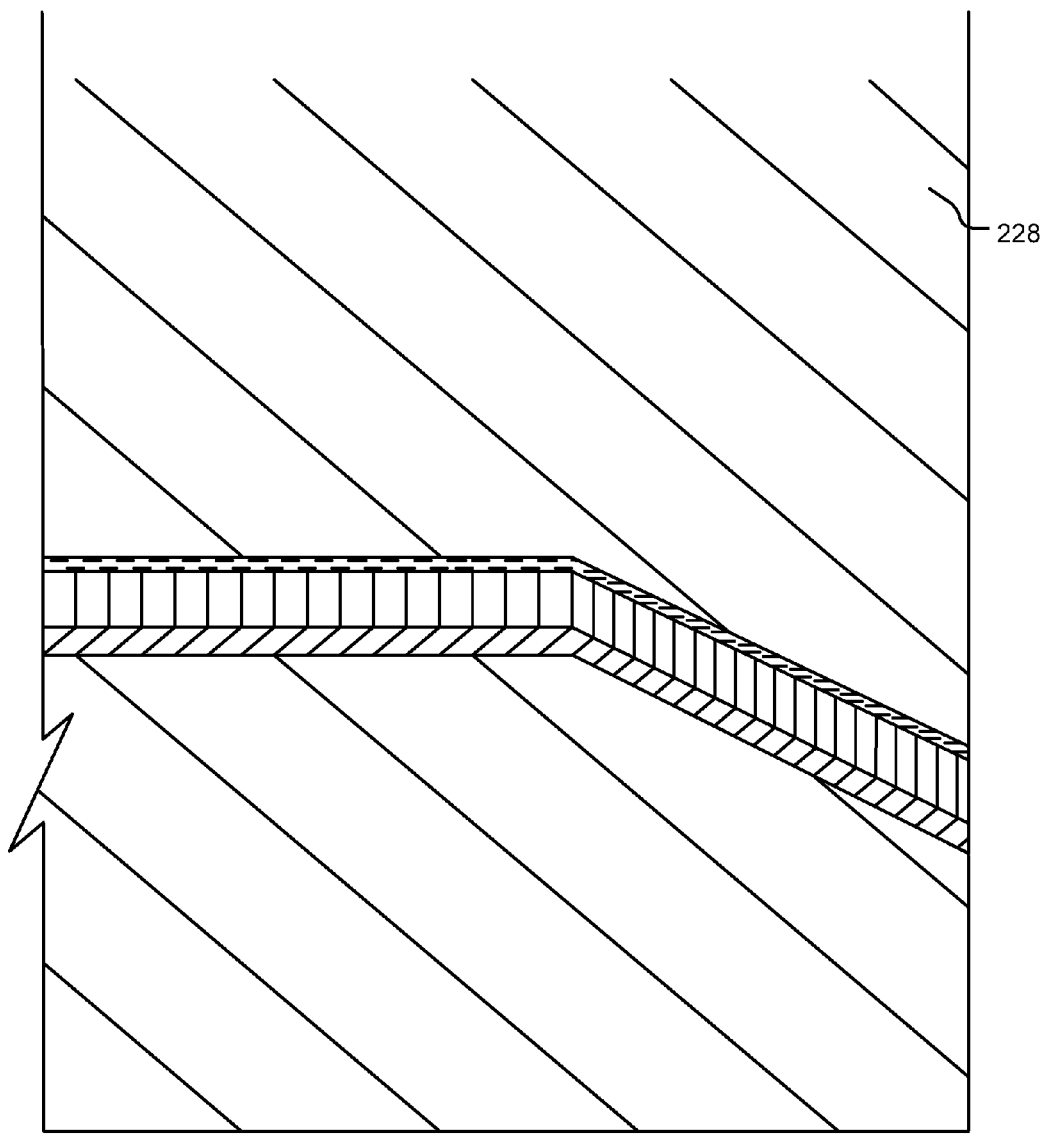
FIG. 2H illustrates a second magnetic material layer disposed above the sacrificial layer, in accordance with one embodiment.

Once the gap is restored to a substantially uniform thickness, a second layer of magnetic material may be deposited. For example, FIG. 2H shows a second layer of magnetic material 228 that may be used as a front shield for a write head. One may utilize FeCo or FeNiCo solid solutions as the magnetic material, for example. The thickness may be in the range of a few nanometers to a few hundreds of nanometers. In accordance with one embodiment, a thickness of 5-50 nm may be used.

As can be seen from FIG. 2H, the resulting write gap is substantially uniform and is not affected by the intermediate photolithography and etching steps that take place before the deposition of the second layer of magnetic material.

Figure 3:
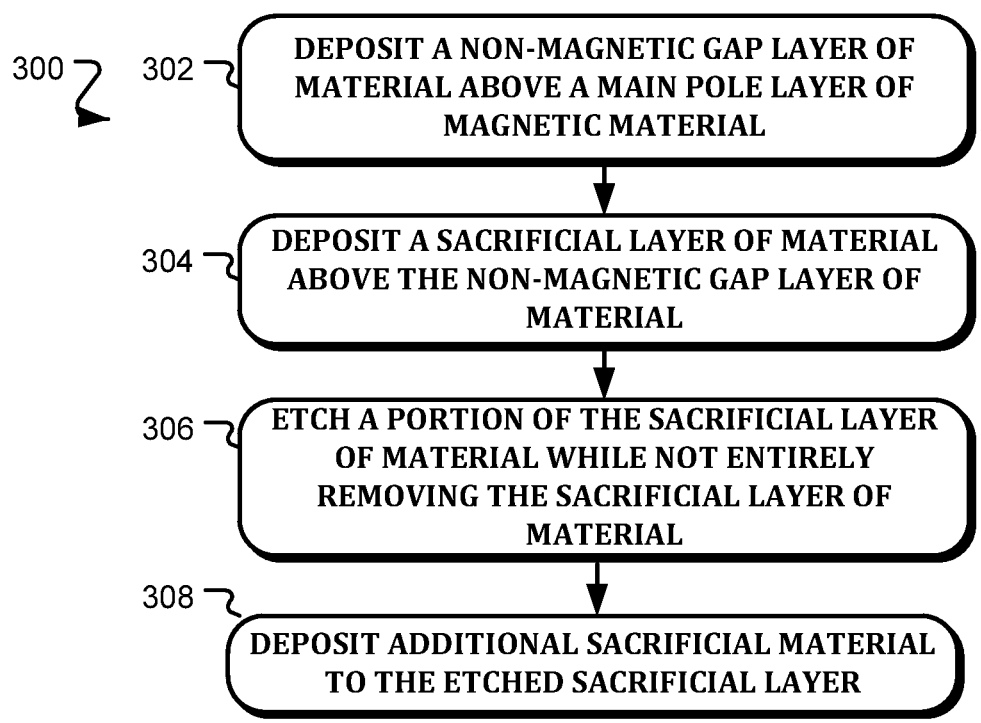
FIG. 3 shows a flow chart illustrating a method of forming a substantially uniform gap layer, in accordance with one embodiment.

Referring now to FIG. 3, a flow chart 300 illustrating aspects of the above-described process can be seen. In block 302, a non-magnetic gap layer of material may be deposited above a main pole layer of magnetic material. In block 304, a sacrificial layer of material may be deposited above the non-magnetic gap layer of material. In block 306, a portion of the sacrificial layer may be processed, for example by an etch process, while not entirely removing the sacrificial layer of material. And, in block 308, additional sacrificial material may be deposited to the etched sacrificial layer.

Figure 4:
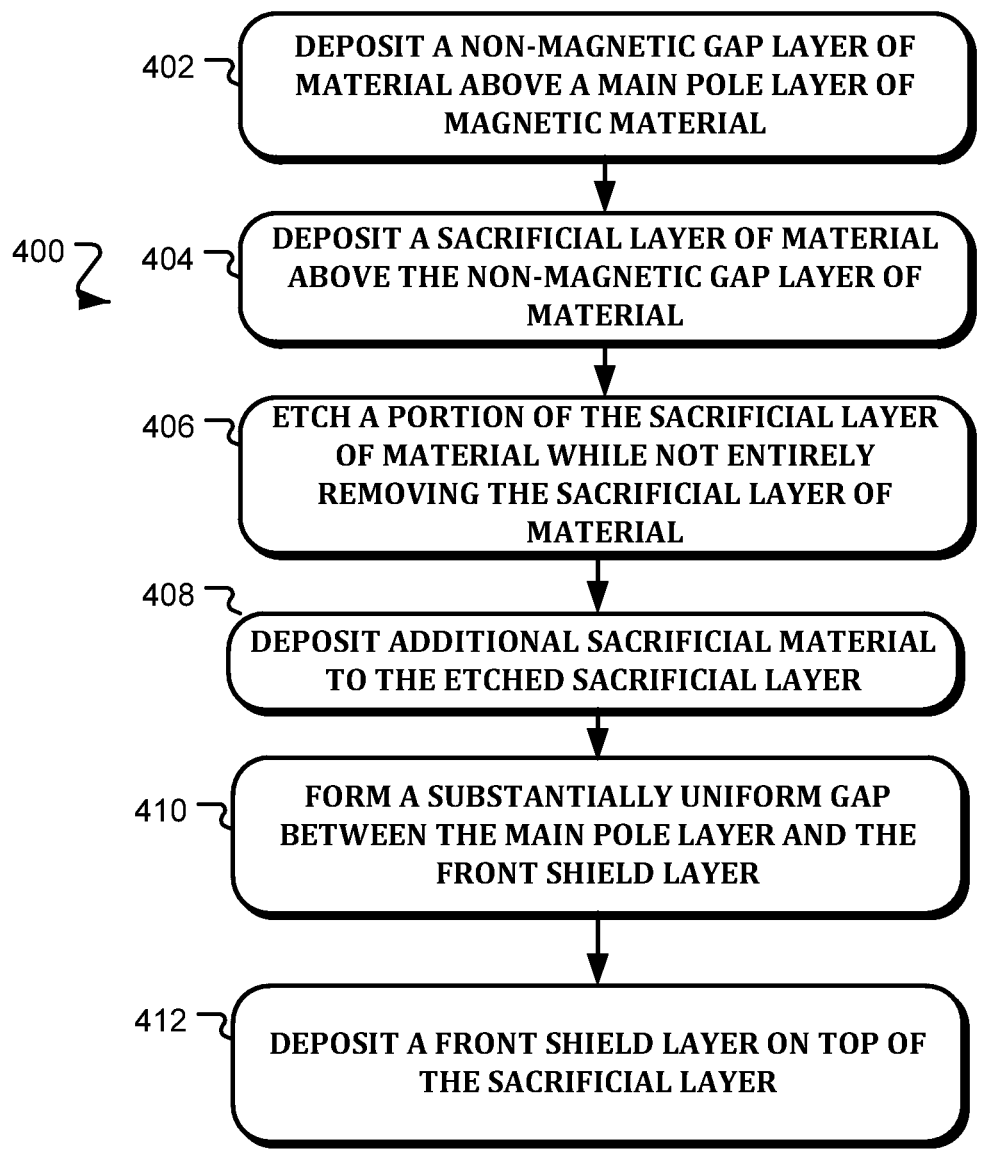
FIG. 4 shows a flow chart illustrating another embodiment of forming a gap layer, in accordance with one embodiment.

In FIG. 4, a flow chart 400 illustrates a more detailed embodiment. In block 402, a non-magnetic layer of material is deposited above a main pole layer of magnetic material. The main pole layer of magnetic material may already be in a beveled configuration. It should be appreciated that multiple layers and different materials may be used to form the gap. Block 404 illustrates that a sacrificial layer of material may be deposited on top of the top non-magnetic gap layer of material.

According to block 406, an etch or other processing step may be performed on the structure. Such processing may remove portions of the sacrificial layer while not necessarily removing the entire sacrificial layer so as to expose any underlying layers, particularly along the bevel edge area. The result of the etching or other processing will be that the sacrificial layer will be uneven. Thus, in block 408, additional sacrificial material may be deposited on the etched sacrificial layer. The deposition can be controlled so as to form a substantially uniform gap between the main pole layer and a subsequently applied front shield layer, as shown in block 410. Then, a front shield layer of material may be applied on top of the sacrificial layer.

In accordance with another embodiment, a different utility can be achieved. Namely, current processes typically utilize a magnetic material such as NiFe as a seed layer prior to depositing a layer of magnetic material, such as FeCo, as the front shield layer. The NiFe has a magnetic moment property of about 1.0 T. This use of magnetic material as the seed layer can degrade the trailing edge (TE) field gradient which in turn decreases the performance of the recording head.

To address this issue, one embodiment utilizes a non-magnetic material as the seed layer for the magnetic material used in the front shield layer. This non-magnetic material allows a better field gradient to be achieved in contrast to a magnetic material such as NiFe. Different materials may be utilized as the non-magnetic material seed layer. But, one possible choice is Ruthenium. Other possible materials are NiRu, NiCr, Cu, and high moment material with combinations of Fe, Ni, and Co alloys, for example. The thickness of the seed layer can be in the range of 1-10 nm, for example.

The deposition process can be similar to that shown with respect to FIGS. 2A through 2H where a non-magnetic seed layer is utilized for a second layer of magnetic material. Moreover, FIG. 5 illustrates a flow chart demonstrating various aspects.

Figure 5:
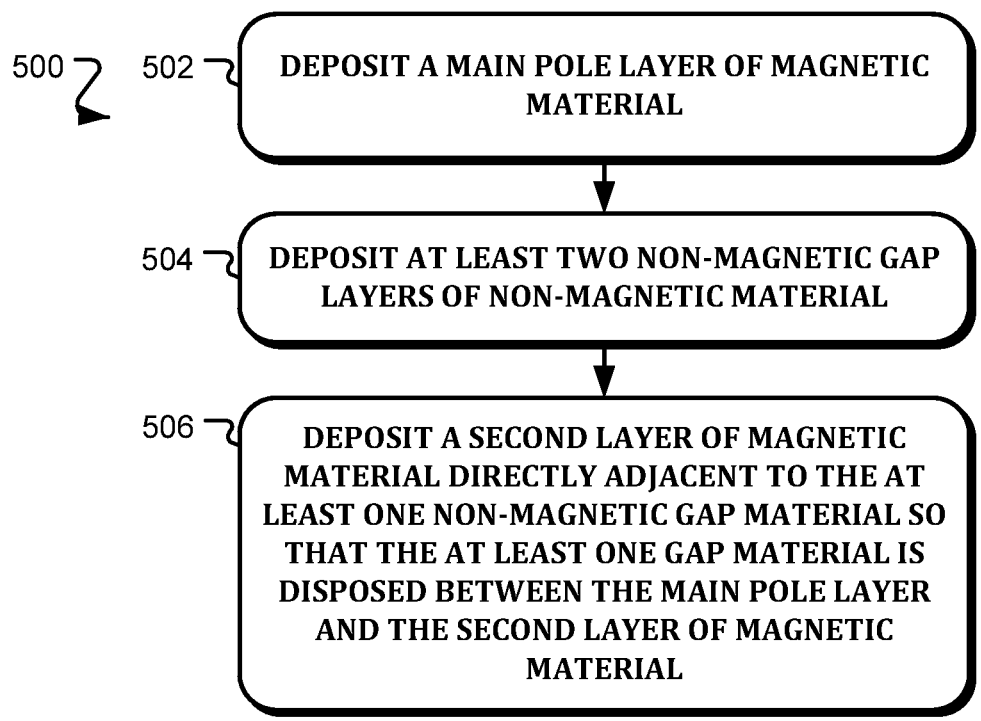
FIG. 5 shows a flow chart illustrating a method of utilizing a non-magnetic seed layer in accordance with one embodiment.

In flow chart 500 of FIG. 5, block 502 shows that a main pole layer of magnetic material is deposited. In block 504, at least two non-magnetic gap layers of material are deposited. And, in block 506, a second layer of magnetic material is deposited. Notably, the second layer of magnetic material is deposited directly adjacent to the upper layer of non-magnetic gap material. This allows the non-magnetic gap material to serve as a seed layer for the second layer of magnetic material.

Figure 6:
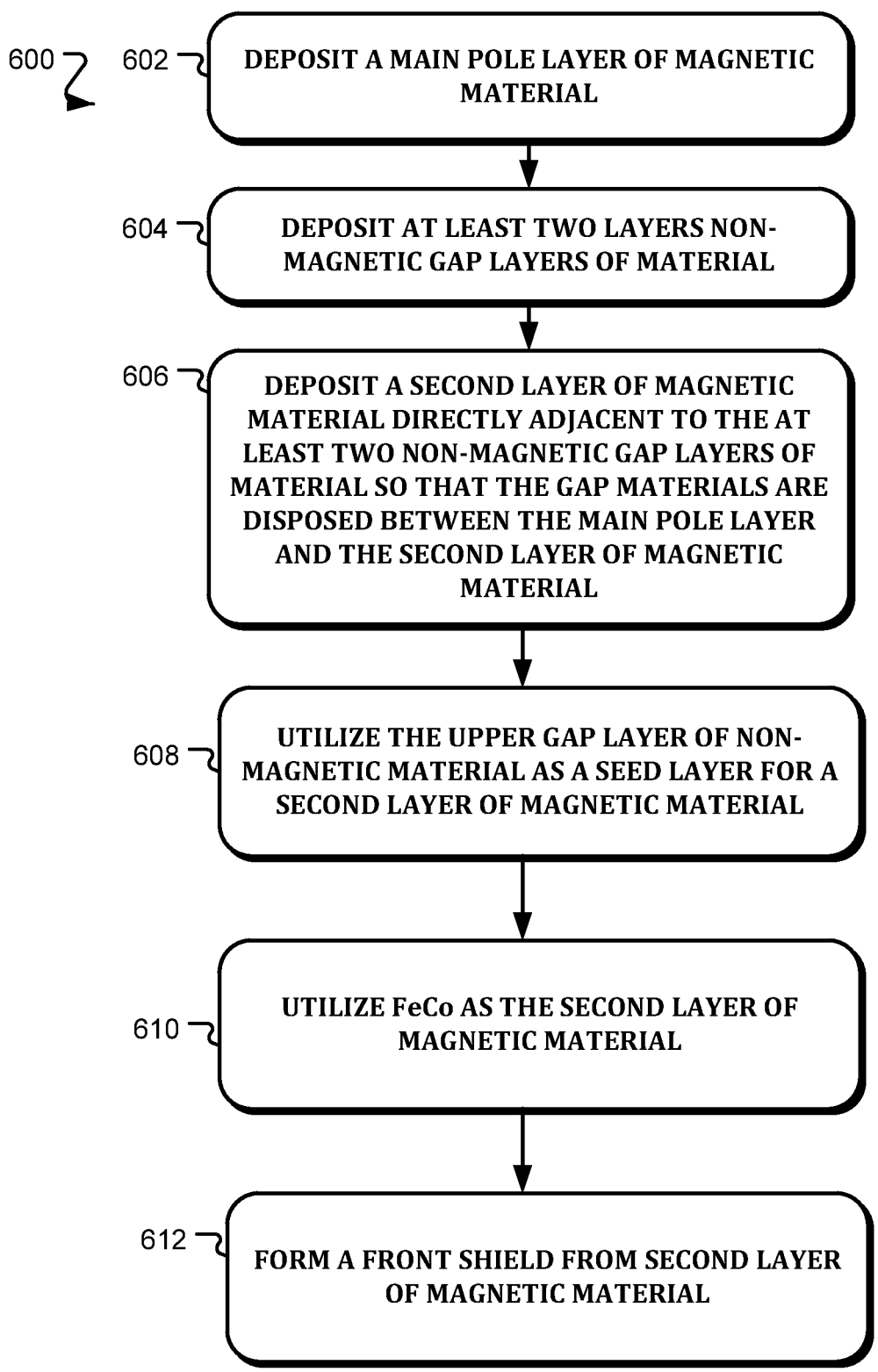
FIG. 6 shows a flow chart illustrating another embodiment of utilizing a non-magnetic seed layer in accordance with one embodiment.

FIG. 6 illustrates a somewhat more detailed embodiment. In flow chart 600 of FIG. 6, a main pole layer of magnetic material is deposited, in block 602. In block 604, at least two non-magnetic gap layers of material are deposited. As noted in an earlier embodiment, the gap may be formed from multiple layers, such as a first layer of Ruthenium followed by a layer of $Al_2O_3$, and followed by a seed layer of Ruthenium.

In block 606, a second layer of magnetic material may be deposited. This layer may be used, for example, as a front shield in a write head. This second layer may be deposited directly adjacent the non-magnetic gap material so as to form a sufficient gradient. Moreover, this non-magnetic gap material may be used as a seed layer for the second layer of magnetic material, as shown by block 608. As shown by block 610, FeCo may be utilized as the material for the second layer of magnetic material. Block 612 illustrates that the second layer of magnetic material may be formed into a front shield for use in a write head.

Figure 7:
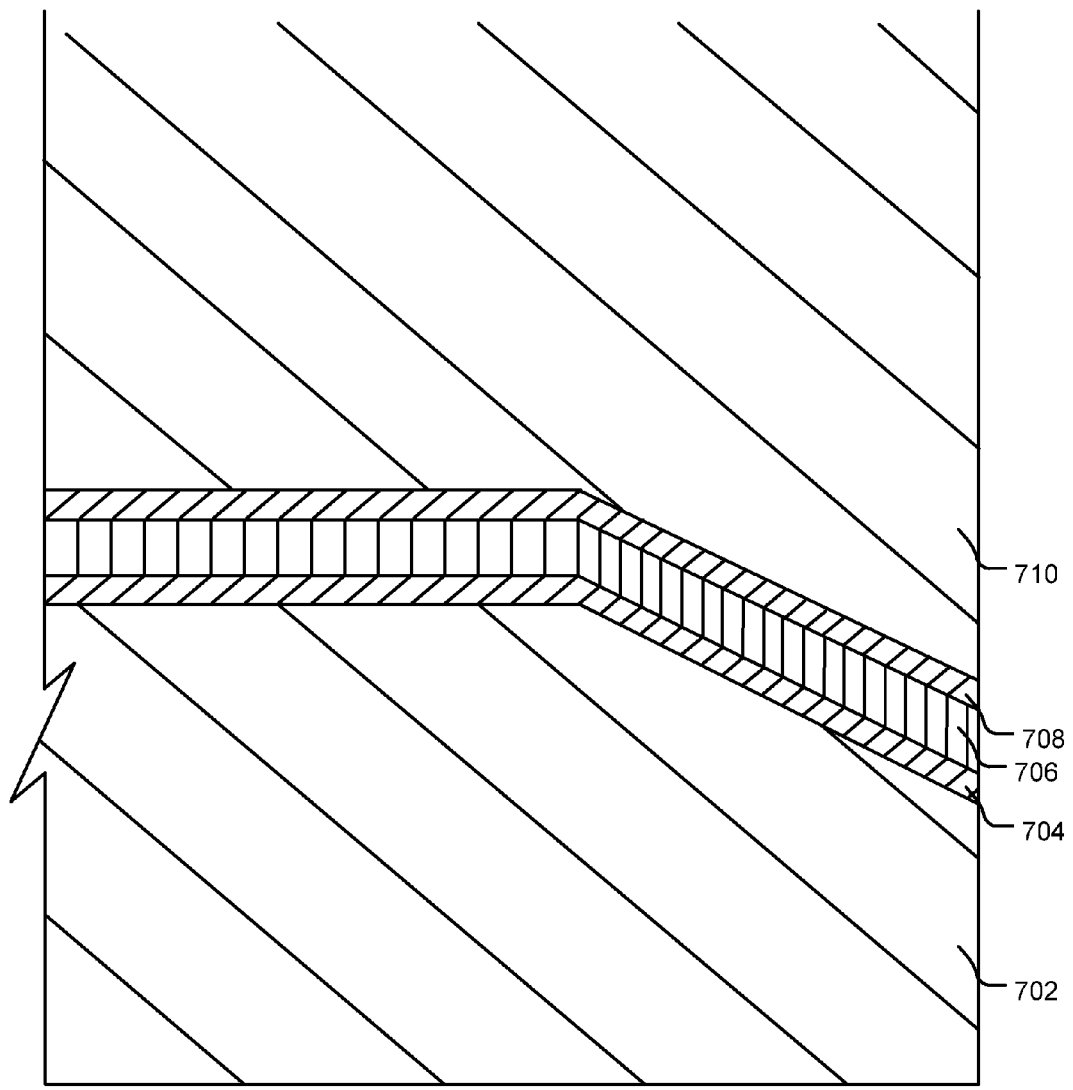
FIG. 7 shows a cross-section of a write gap for a write head having at least two layers of non-magnetic material in the write gap, in accordance with one embodiment.

FIG. 7 illustrates an example of a gap layer that is formed from two or more gap layers of non-magnetic material. FIG. 7 shows a first layer of magnetic material 702 that serves as the write head. FeCo is one type of magnetic material that can be used for the first magnetic layer. A first gap layer of non-magnetic material 704 is shown disposed above and directly adjacent to the magnetic material. One material that can be used, for example, is Ruthenium. A second gap layer of non-magnetic material 706 is shown disposed above and directly adjacent the first gap layer. For example, $Al_2O_3$ is one type of material that could be used for this material. A third gap layer of non-magnetic material 708 is shown disposed above and directly adjacent the second gap layer. The material Ruthenium could be utilized for this layer to provide symmetry with the first gap layer. Moreover, Ruthenium is useful in serving as a seed layer for the second layer of magnetic material 710. The layer 710 is shown disposed above and directly adjacent to the third gap layer. FeCo is one example of a magnetic material that can be used for layer 710 in order to serve as a front shield for the main pole.

It is noted that many of the structures, materials, and acts recited herein can be recited as means for performing a function or step for performing a function. Therefore, it should be understood that such language is entitled to cover all such structures, materials, or acts disclosed within this specification and their equivalents, including any matter incorporated by reference.

It is thought that the apparatuses and methods of embodiments described herein will be understood from this specification. While the above description is a complete description of specific embodiments, the above description should not be taken as limiting the scope of the patent as defined by the claims.

What is claimed is:

1. An apparatus comprising:
    a main pole layer of magnetic material;
    a non-magnetic gap layer of material above the main pole layer;
    an etched first sacrificial layer of material above the non-magnetic gap layer of material;
    a second sacrificial layer of material above the etched first sacrificial layer of material;
    wherein the first sacrificial layer of material comprises a magnetic moment approximately equivalent to the magnetic moment of the main pole material.

2. The apparatus as claimed in claim 1 and further comprising:
    a front shield layer on top of the second sacrificial layer of material.

3. The apparatus as claimed in claim 2 and further comprising:
    a substantially uniform gap between the main pole layer and the front shield layer.

4. The apparatus as claimed in claim 1 wherein the non-magnetic gap layer comprises $Al_2O_3$.

5. The apparatus as claimed in claim 1 wherein the non-magnetic gap layer comprises Ruthenium.

6. The apparatus as claimed in claim 1 wherein the first sacrificial layer comprises Ruthenium.

7. The apparatus as claimed in claim 1 wherein the first sacrificial layer of non-magnetic material comprises Cu.

8. The apparatus as claimed in claim 1 wherein the second sacrificial layer material utilizes a non-magnetic seed material.

9. An apparatus comprising:
- a main pole layer of magnetic material;
- a non-magnetic gap layer of material above the main pole layer;
- an etched first sacrificial layer of material above the non-magnetic gap layer of material;
- a second sacrificial layer of material above the etched first sacrificial layer of material;
- wherein the first sacrificial layer comprises NiRu.

* * * * *